(12) United States Patent
Wada

(10) Patent No.: US 9,168,930 B2
(45) Date of Patent: Oct. 27, 2015

(54) CEILING TRANSPORT VEHICLE

(75) Inventor: Yoshinari Wada, Osaka (JP)

(73) Assignee: Daifuku Co., Ltd., Osaka-shi (JP)

( * ) Notice: Subject to any disclaimer, the term of this patent is extended or adjusted under 35 U.S.C. 154(b) by 504 days.

(21) Appl. No.: 13/386,787

(22) PCT Filed: Oct. 15, 2010

(86) PCT No.: PCT/JP2010/068172
§ 371 (c)(1),
(2), (4) Date: Jan. 24, 2012

(87) PCT Pub. No.: WO2011/065146
PCT Pub. Date: Jun. 3, 2011

(65) Prior Publication Data
US 2012/0118845 A1    May 17, 2012

(30) Foreign Application Priority Data

Nov. 27, 2009   (JP) .................................. 2009-270510

(51) Int. Cl.
*B65G 1/04* (2006.01)
*B61B 3/02* (2006.01)
*H01L 21/677* (2006.01)

(52) U.S. Cl.
CPC .............. *B61B 3/02* (2013.01); *H01L 21/6773* (2013.01); *H01L 21/67733* (2013.01); *B65G 1/0464* (2013.01); *B65G 2201/0297* (2013.01)

(58) Field of Classification Search
CPC .... B23Q 7/04; B66C 1/485; B66C 2700/017; B61B 3/00
USPC .................................................. 414/626, 940
See application file for complete search history.

(56) References Cited

U.S. PATENT DOCUMENTS

| | | | | |
|---|---|---|---|---|
| 5,454,328 A * | 10/1995 | Matsuzaki et al. ............ | 104/139 |
| 6,494,308 B2 * | 12/2002 | Bonora et al. ............. | 198/465.2 |
| 6,575,687 B2 * | 6/2003 | Bonora et al. ................ | 414/217 |
| 6,851,913 B2 * | 2/2005 | Iizuka ........................... | 414/626 |
| 6,889,813 B1 * | 5/2005 | Trammell et al. .......... | 198/346.3 |
| 7,219,793 B2 * | 5/2007 | Robertsson et al. ......... | 198/795 |
| 2004/0253087 A1 * | 12/2004 | Iizuka ........................... | 414/626 |
| 2010/0290873 A1 * | 11/2010 | Bonora et al. ................ | 414/267 |
| 2011/0158776 A1 * | 6/2011 | Inui .............................. | 414/277 |

FOREIGN PATENT DOCUMENTS

| JP | 39397 U | 1/1991 |
|---|---|---|
| JP | 489796 A | 3/1992 |
| JP | 589389 U | 12/1993 |

(Continued)

*Primary Examiner* — Saul Rodriguez
*Assistant Examiner* — Emery Hassan
(74) *Attorney, Agent, or Firm* — The Webb Law Firm

(57) ABSTRACT

A ceiling transport vehicle in which articles may be transferred precisely while allowing its travel portion to travel smoothly along a set travel path is provided. The ceiling transport vehicle has a pair of guiding bodies which guide the travel portion along a set travel path by contacting each of right and left lateral sides of a guide rail with a pair of contacting members that are supported by the travel portion such that the contacting members can be moved away from each other and moved toward each other in a lateral width direction. The ceiling transport vehicle also has a switching portion for moving each of the pair of contacting members away from each other and toward each other to switch between a holding state and a holding release state.

8 Claims, 8 Drawing Sheets

(56) References Cited

FOREIGN PATENT DOCUMENTS

| JP | 8169531 A | 7/1996 |
| JP | 9110113 A | 4/1997 |
| JP | 2005280946 A | 10/2005 |
| JP | 2007153480 A | 6/2007 |
| JP | 200923812 A | 2/2009 |

* cited by examiner

CEILING TRANSPORT VEHICLE

BACKGROUND OF THE INVENTION

1. Field of the Invention

The present invention relates to a ceiling transport vehicle comprising a travel portion that travels along a guide rail installed on a ceiling side along a set travel path, a main body portion that is suspended and supported by the travel portion and that supports an article such that the article can be moved vertically, and a pair of guiding bodies that contact right and left lateral sides of the guide rail to guide the travel portion along the set travel path.

2. Description of Related Art

Such ceiling transport vehicles are configured to guide its travel portion, which travels on a guide rail along a set travel path, with a pair of guiding bodies, and to vertically move an article with the travel portion stopped at an article transfer position, which is arranged at a location that corresponds to an article transfer target location in the travel path, so as to transfer the article to and from the article transfer target location.

And in such a conventional ceiling transport vehicle, the pair of guiding bodies are caused to contact right and left lateral side faces of the guide rail to restrict the movement of the travel portion relative to the guide rail in the lateral width direction, thereby to restrict a displacement of the travel portion in the lateral width direction with respect to the article transfer position when the travel portion is stopped. The ceiling transport vehicle is configured to transfer an article to and from an article transfer target location with the displacement of the travel portion in the lateral width direction being restricted with respect to the article transfer position in this manner. (See, for example, Patent Document 1.)

In this conventional ceiling transport vehicle, the guide rail consists of a pair of rail portions spaced apart from each other in the lateral width direction. And the pair of guiding bodies are provided between the pair of rail portions such that the pair of guiding bodies contact respective inward faces of the rail portions (i.e., a left hand side surface of the right hand side rail portion, and the right hand side surface of the left hand side rail portion) which face each other and which define the right and left lateral side faces of the guide rail. And even if there are locations where the distance between the pair of rail portions is narrower due to inaccuracies in the installation of the pair of rail portions or changes that occur over time, the pair of guiding bodies are configured or positioned such that the pair of guiding bodies will not be caught and stuck at these locations, so that the travel portion can travel smoothly along a set travel path. More specifically, for example, by forming the pair of guiding bodies with resilient members so that they can deform elastically, or by positioning the pair of guiding bodies such that they can retreat away from the rail portions and urging them toward the rail portions, the pair of guiding bodies are configured or positioned such that they will not be caught and get stuck at a location where the distance between the pair of rail portions is narrower so that the travel portion can travel smoothly along the set travel path.

PRIOR ART DOCUMENTS

Prior Documents

Patent Document 1: JP Publication Of Application No. 2005-280946

SUMMARY OF THE INVENTION

As described above, with a ceiling transport vehicle such as one in the conventional art where the travel portion is restricted from being displaced from the article transfer position in the lateral width direction by a pair of guiding bodies for guiding the travel portion along a travel path, the stop position of the travel portion is sometimes displaced in the lateral width direction with respect to the article transfer position due, for example, to elastic deformation of the pair of guiding bodies. And when the main body portion suspended and supported by the travel portion is displaced in the lateral width direction with respect to the article transfer position for that reason, there is a possibility that the articles can not be transferred precisely to or from the article transfer target location. A high degree of accuracy is required for transfer of articles to or from article transfer target locations especially when transporting containers for storing semiconductor substrates as articles by the ceiling transport vehicle. And when the stop position of the travel portion is displaced in the lateral width direction with respect to the article transfer position, there is a high possibility that the article can not be transferred precisely to or from the article transfer target location.

The present invention was made in light of the present state of the art described above. And its object is to provide a ceiling transport vehicle in which articles may be transferred precisely while allowing its travel portion to travel smoothly along a set travel path.

A ceiling transport vehicle in accordance with the present invention comprises a travel portion that travels along a guide rail installed on a ceiling side along a set travel path; a main body portion that is suspended and supported by the travel portion and that supports an article such that the article can be moved vertically; and a pair of guiding bodies that contact right and left lateral sides of the guide rail to guide the travel portion along the set travel path. The vehicle further comprises a pair of contacting members that are supported by one of the travel portion and the main body portion such that the contacting members can be moved away from each other and moved toward each other in a lateral width direction that is perpendicular to a travel direction of the travel portion, and switching means for moving each of the pair of contacting members away from each other and toward each other to switch between a holding state in which the travel portion is positioned and held in an article transfer position in the lateral width direction with respect to the guide rail by causing the pair of contacting members to contact right and left lateral sides of the said guide rail, and a holding release state in which the pair of contacting members are spaced apart from the guide rail.

That is, by moving the pair of contacting members toward or away from each other to switch the switching means to the holding state, one of the contacting members contacts the guide rail before the other and pushes against the guide rail if the travel portion is displaced from the article transfer position in the lateral width direction. The travel portion is then moved in the lateral width direction by the reaction force; thus, the position of the travel portion can be corrected to the article transfer position. And when the position of the travel portion is corrected to the article transfer position, each of the pair of contacting members contacts the guide rail, and is switched to the holding state. By maintaining this holding state, the travel portion can be positioned and held in the article transfer position, and the position of the travel portion can be precisely restricted from being displaced from the article transfer position in the lateral width direction. Because, by precisely restricting the position of the travel portion from being displaced from the article transfer position in the lateral width direction, the main body portion suspended and supported by the travel portion can also be precisely restricted from being displaced in the lateral width direction with respect to the article transfer position, an article can be transferred precisely to or from the article transfer target location which is provided below the article transfer position.

And by switching the switching means to the holding release state and thus by moving the pair of contacting members away from the guide rail, contacting of the guide rail by the pair of contacting members is avoided when the travel portion travels along the set travel path, thus allowing the travel portion to travel smoothly along the set travel path.

Therefore, a ceiling transport vehicle is provided in which articles may be transferred precisely while allowing its travel portion to travel smoothly along a set travel path.

In an embodiment of the present invention, the guide rail preferably includes a pair of rail portions spaced apart from each other in the lateral width direction, wherein the pair of contacting members are preferably located between the pair of rail portions, and wherein the switching means is preferably configured to move each of the pair of contacting members away from each other to switch to the holding state, and to move each of the pair of contacting members toward each other to switch to the holding release state.

That is, by configuring the guide rail to include a pair of rail portions spaced apart from each other in the lateral width direction, the weight of the guide rail is kept from becoming large while making it difficult for the travel portion to tilt by having a greater lateral width for supporting the travel portion. And the pair of guiding bodies are provided between the pair of rail portions spaced apart from each other in the lateral width direction. By providing the pair of guiding bodies using the space formed between the pair of rail portions in this manner, the ceiling transport vehicle can be configured compactly in the lateral width direction compared with a case where the pair of guiding bodies are provided outward of the pair of rail portions in the lateral width direction.

In an embodiment of the present invention, the main body portion preferably includes a support for supporting the article, vertical movement operating means for vertically moving the support, and slide operating means for slidingly moving the vertical movement operating means and the support with respect to the said travel portion in the lateral width direction between a retracted position directly below the travel portion and a projected position which is displaced to one side in the lateral width direction with respect to the said travel portion, wherein a contacting member, of the pair of contacting members, located on an opposite side from the projected position with respect to the retracted position preferably has a restricting member that is supported by the travel portion and that contacts an undersurface of the guide rail to restrict tilting of the travel portion.

That is, the vertical movement operating means and the support can be moved between a retracted position directly below the travel portion and a projected position which is displaced to one side in the lateral width direction with respect to the said travel portion by slidingly moving the vertical movement operating means and the support with respect to the said travel portion in the lateral width direction by the slide operating means. And, an article can be transferred to or from the article transfer target location provided directly below the article transfer position by vertically moving the support by the vertical movement operating means with the vertical movement operating means and the support moved to the retracted position. And an article can be transferred in a broader range in the lateral width direction because an article can be transferred to or from the article transfer target location provided at a location displaced from directly below the article transfer position in the lateral width direction by vertically moving the support by the vertical movement operating means with the vertical movement operating means and the support moved to the projected position.

Also, because the load of the main body portion is offset toward one side in the lateral width direction when the vertical movement operating means and the support are moved to the projected position, the other side of the travel portion in the lateral width direction may be lifted off the guide rail and the travel portion may tilt. However, because a restricting member is provided to a contacting member, of the pair of contacting members, located on an opposite side from the projected position with respect to the retracted position, the other side of the travel portion in the lateral width direction is prevented from being lifted off the guide rail, thus preventing the tilting of the travel portion because the restricting member of the contacting member on the other side contacts an undersurface of the guide rail. Therefore, an article can be precisely transferred to or from an article transfer location.

In an embodiment of the present invention, the pair of contacting members are preferably located in such positions as to overlap with the pair of guiding bodies as seen in the travel direction.

That is, by positioning the pair of contacting members in such positions as to overlap with the pair of guiding bodies as seen in the travel direction, the pair of contacting member can contact the area—in the right and left lateral sides of the guide rail—that the pair of guiding bodies contact. And because a part or all of the area can be shared between the pair of guiding bodies and the pair of contacting members, it is possible to make it unnecessary to provide a surface which the pair of contacting members can contact in the right and left lateral sides of the guide rail in addition to and vertically spaced from a portion which the pair of guiding bodies contact. In that case, the guide rail can be configured compactly in the vertical direction.

In an embodiment of the present invention, the switching means preferably includes an operatively connecting mechanism which operatively connects the pair of contacting members, and a single actuator which operates the operatively connecting mechanism.

That is, each of the pair of contacting members can be moved away from and toward each other and the switching means can be switched between the holding state and the holding release state by operating the operatively connecting mechanism by the single actuator. And because each of the pair of contacting members can be moved away from and toward each other by the single actuator, the number of the actuators can be reduced compared with a case where each of the pair of contacting members is operated by a separate actuator, thus allowing the configuration of the switching means to be simpler than otherwise.

DESCRIPTION OF THE PREFERRED EMBODIMENTS

An embodiment in which a ceiling transport vehicle of the present invention is provided to an article processing facility is described next with reference to the drawings.

Figure 1:
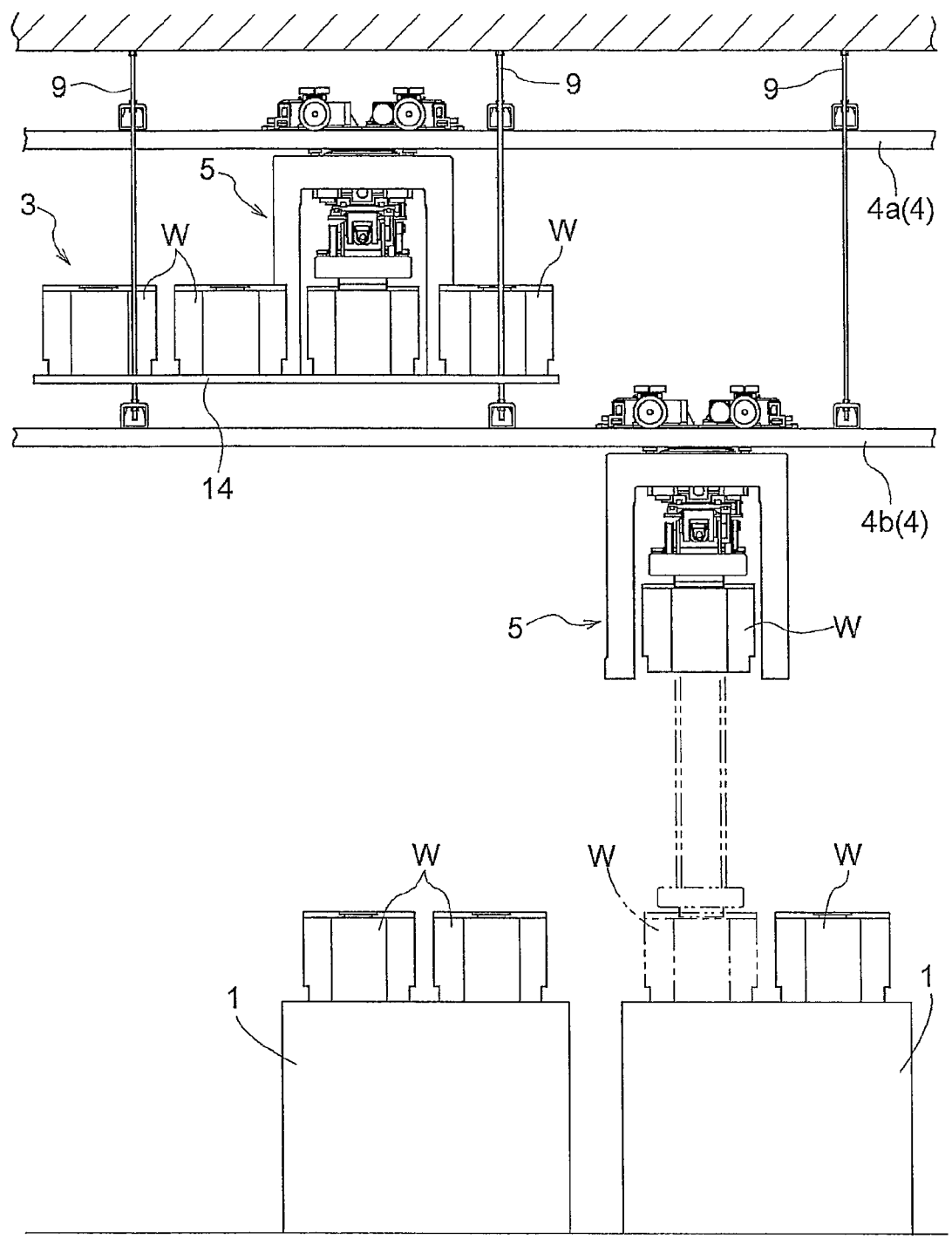
FIG. 1 is a side view of an article processing facility.
Figure 2:
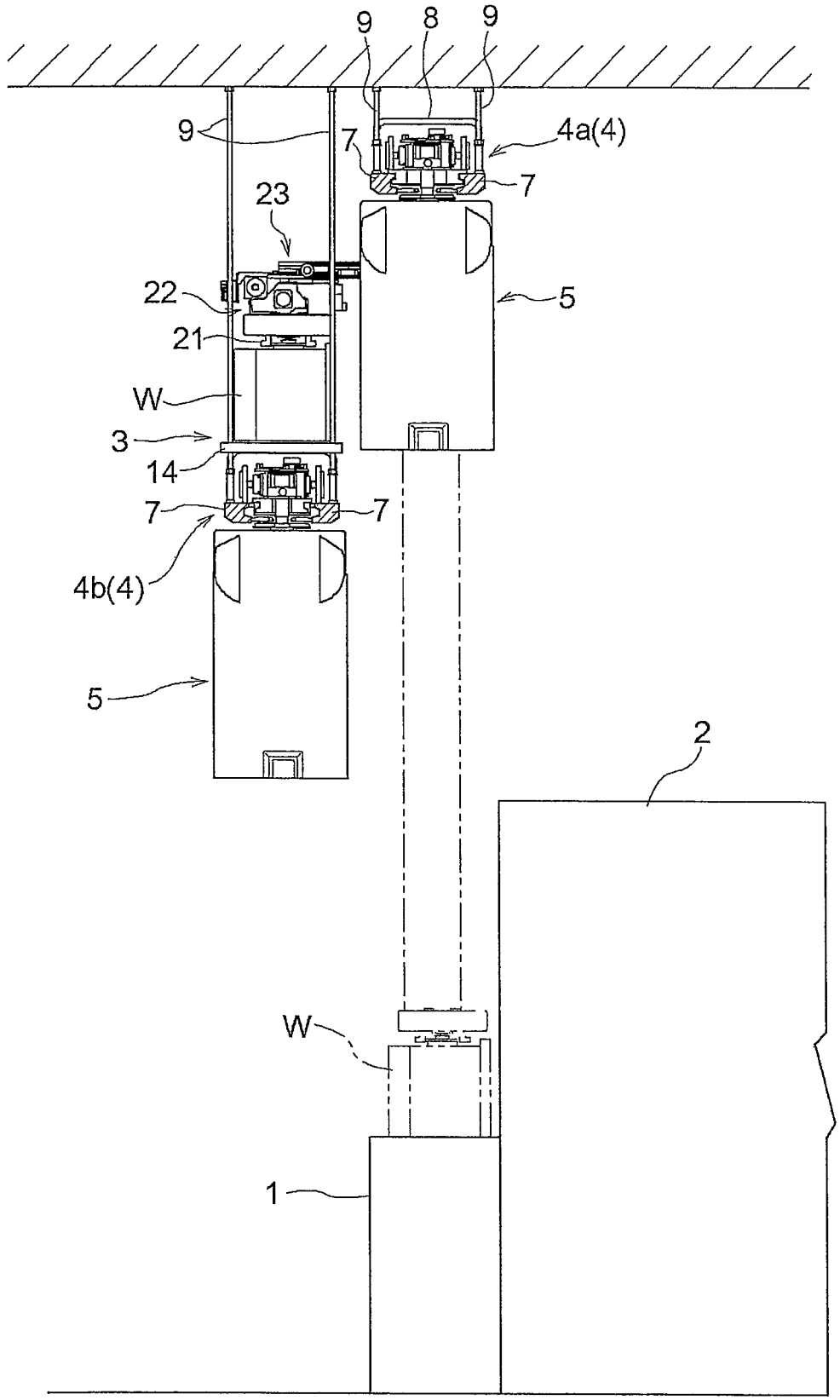
FIG. 2 is a front view of the article processing facility.
Figure 3:
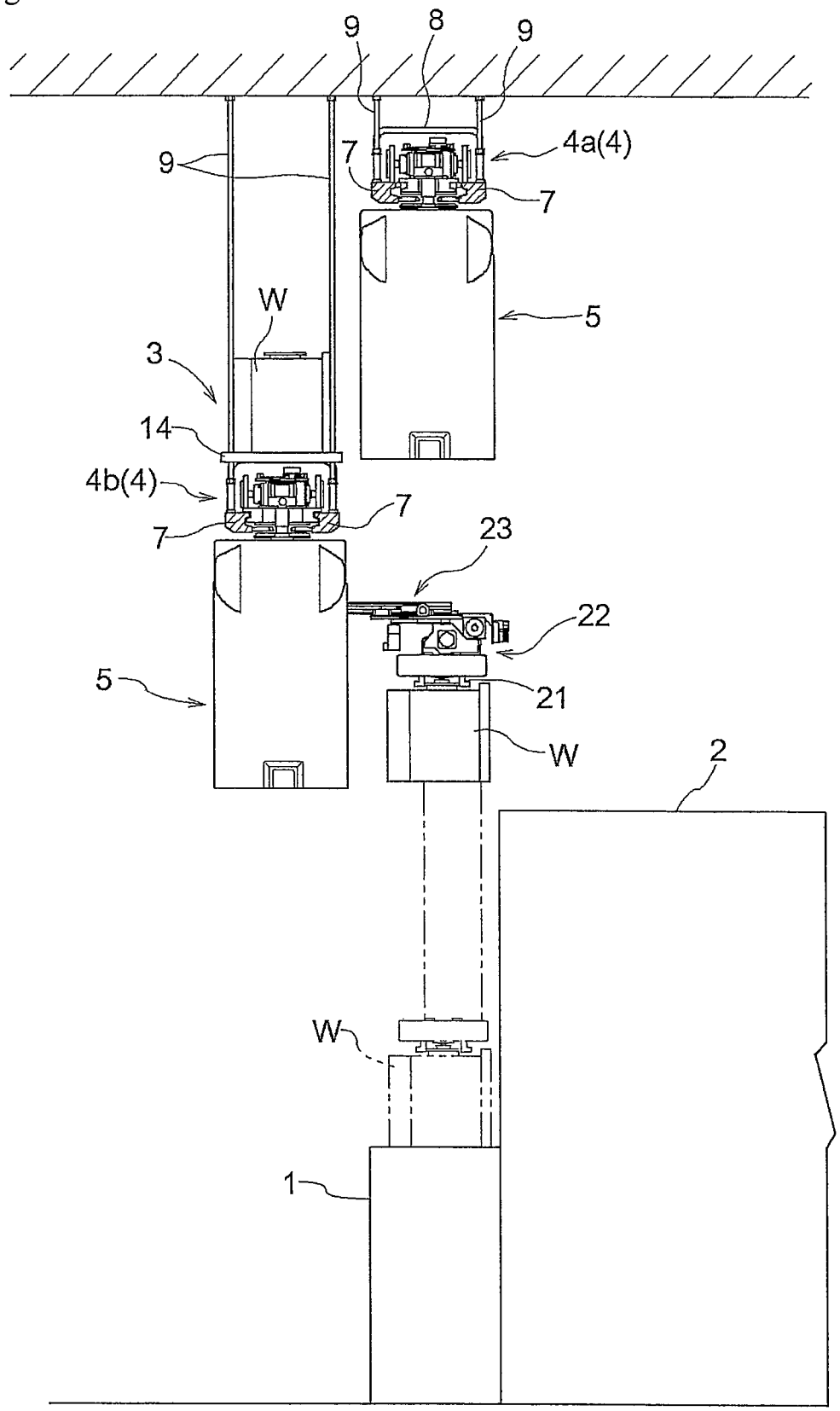
FIG. 3 is a front view of the article processing facility.

As shown in FIGS. 1-3, the article processing facility includes a plurality of processing devices 2 (see FIG. 2) each having a station 1, a storage shelf 3 which is suspended and supported by the ceiling and which can store a plurality of articles W, and ceiling transport vehicles 5 which travel along guide rails 4 installed on the ceiling side along a set travel path set up in advance such that the path extends by way of or adjacent to a plurality of processing devices 2 and the storage shelf 3. In addition, an article W is a container for storing semiconductor substrates, and the processing devices 2 perform predetermined processes to, for example, work-in-process parts which are semiconductor substrates that are being manufactured.

And each ceiling transport vehicle 5 is configured to transfer an article W to or from a station 1 installed below the set travel path and the storage shelf 3 installed on a lateral side of and next to the set travel path. And the ceiling transport vehicles 5 are configured to be capable of transporting articles W between or among a plurality of stations 1, and of temporarily storing on the storage shelf 3 the articles W that are in the process of being transported.

Provided as the guide rails 4 are a higher guide rail 4a which is installed along a higher set travel path arranged at a high position close to the ceiling, and a lower guide rail 4b which is installed along a lower set travel path arranged at a lower position than the higher set travel path. And the lower guide rail 4b is located downwardly with respect to the higher guide rail 4a such that the ceiling transport vehicle 5 that travels along the lower guide rail 4b does not overlap with the ceiling transport vehicle 5 that travels along the higher guide rail 4a as seen in the lateral width direction. In addition, the lower guide rail 4b is displaced in the lateral width direction with respect to the higher guide rail 4a such that the ceiling transport vehicle 5 that travels along the lower guide rail 4b does not overlap with the ceiling transport vehicle 5 that travels along the higher guide rail 4a as seen in a vertical direction. Incidentally, the lower guide rail 4b and the higher guide rail 4a are arranged such that they are next to each other in the lateral width direction and extend in parallel to each other. The lateral width direction is a direction that extends horizontally and that is perpendicular to the travel direction.

The higher guide rail 4a extends through a location directly above the station 1 by virtue of the fact that it is installed along the higher set travel path. And the lower guide rail 4b extends through a location that is displaced in the lateral width direction from a location directly above the station 1 by virtue of the fact that it is installed along the lower set travel path.

And as shown in FIGS. 2 and 3, each guide rail 4 which is either the higher guide rail 4a or the lower guide rail 4b consists of a pair of rail portions 7 which are spaced apart from each other the lateral width direction. The distance between the rail portions 7 in the lateral width direction is held constant because the pair of rail portions 7 are connected to each other by connecting members 8. And, each of the pair of rail portions 7 is kept at a fixed height by being suspended and supported from the ceiling by suspending members 9. Therefore, one of the rail portions 7 is supported by the corresponding suspending members 9, and the other of the rail portions 7 is supported by the corresponding suspending members 9, and the pair of rail portions 7 are connected to each other by the connecting members 8. Incidentally, the connecting members 8 are not shown in FIG. 1.

Figure 5:
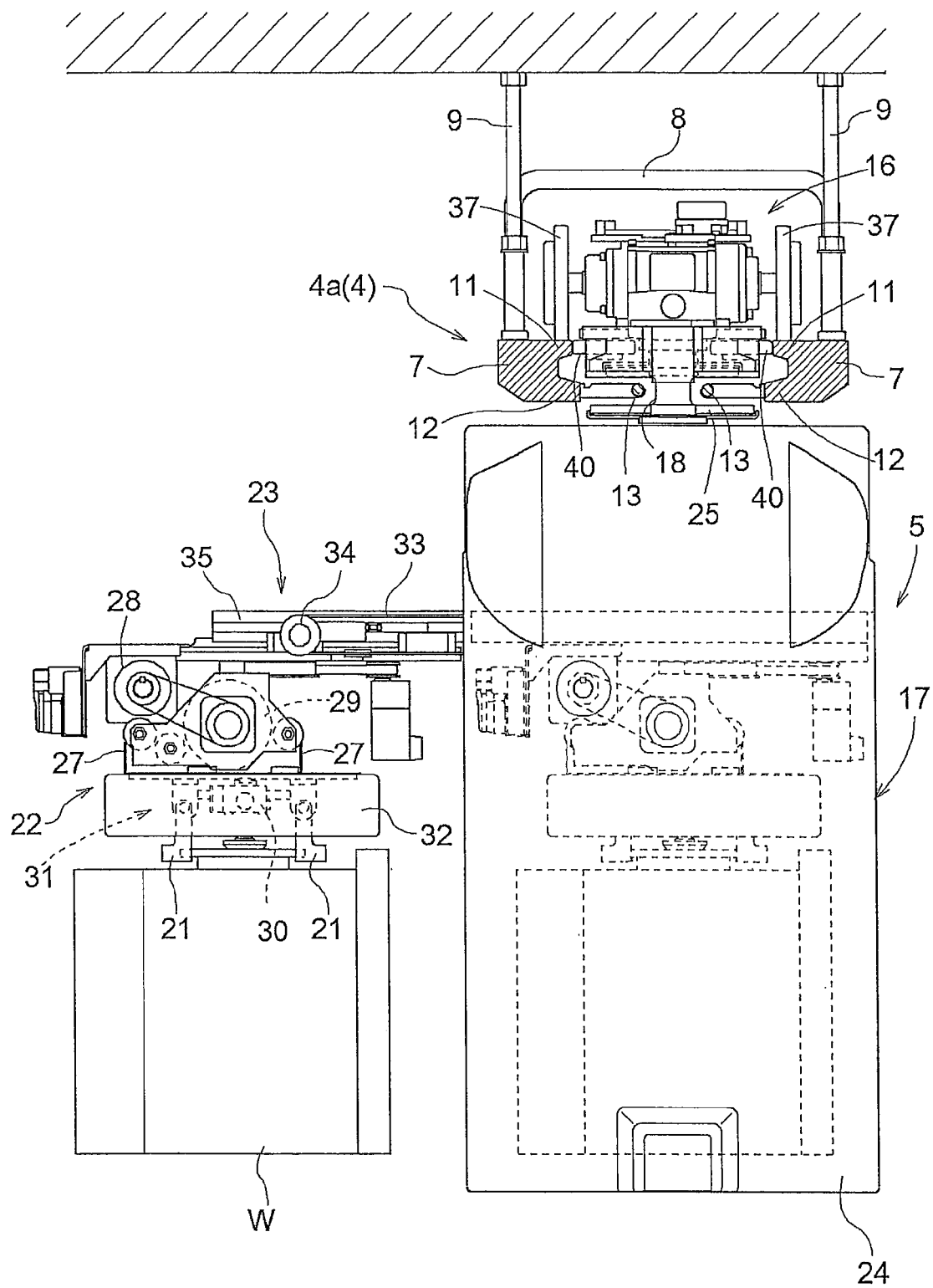
FIG. 5 is a front view of a ceiling transport vehicle.

As shown in FIG. 5, each of the pair of rail portions 7 of the higher guide rail 4a has, in its upper end portion, a guiding projection 11 which is formed to project inwardly in the lateral width direction, and, in its lower end portion, a projection 12 for electricity supply line which is formed to project inwardly in the lateral width direction. The ceiling transport vehicle 5 is in contact with and thus guided by the guiding projections 11. And electricity supply lines 13 which supplies driving electric power to the ceiling transport vehicle 5 are supported by the projections 12 for electricity supply lines. In addition, the guiding projections 11 and the projections 12 for electricity supply lines are formed in the lower guide rail 4b in the manner identical to the higher guide rail 4a.

Figure 6:
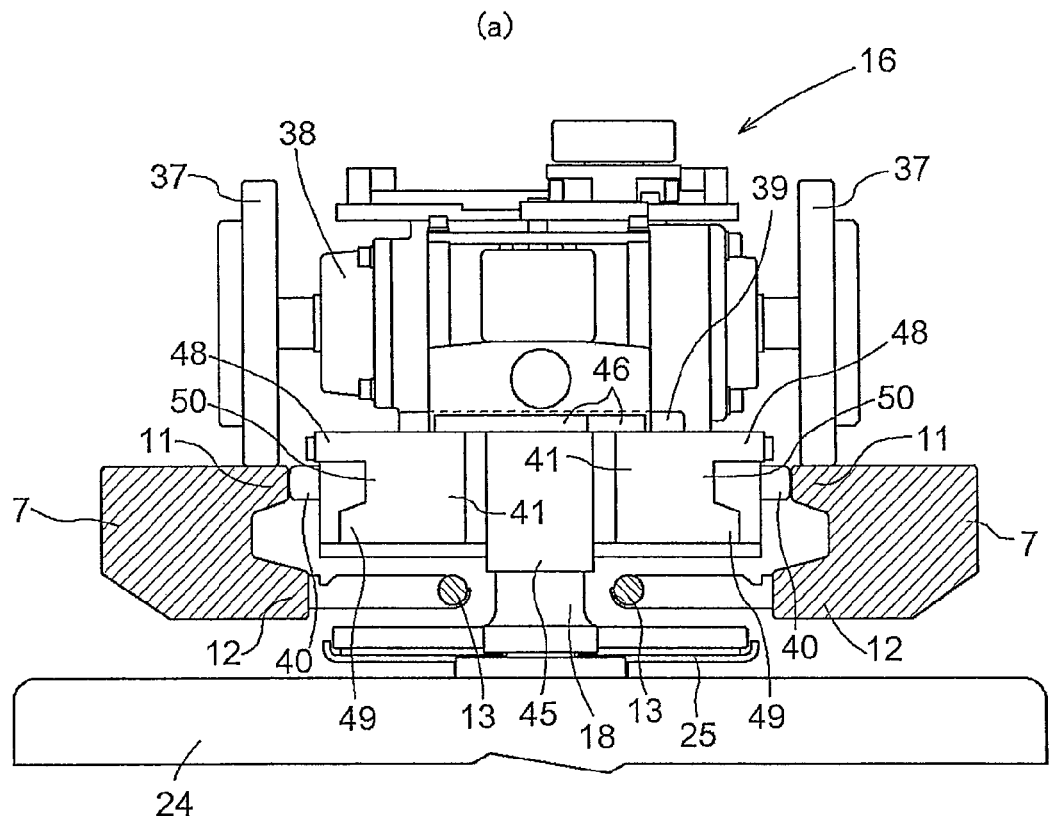
FIG. 6 is a front view of a travel portion showing a holding release state and a holding state of the contacting member.
Figure 6:
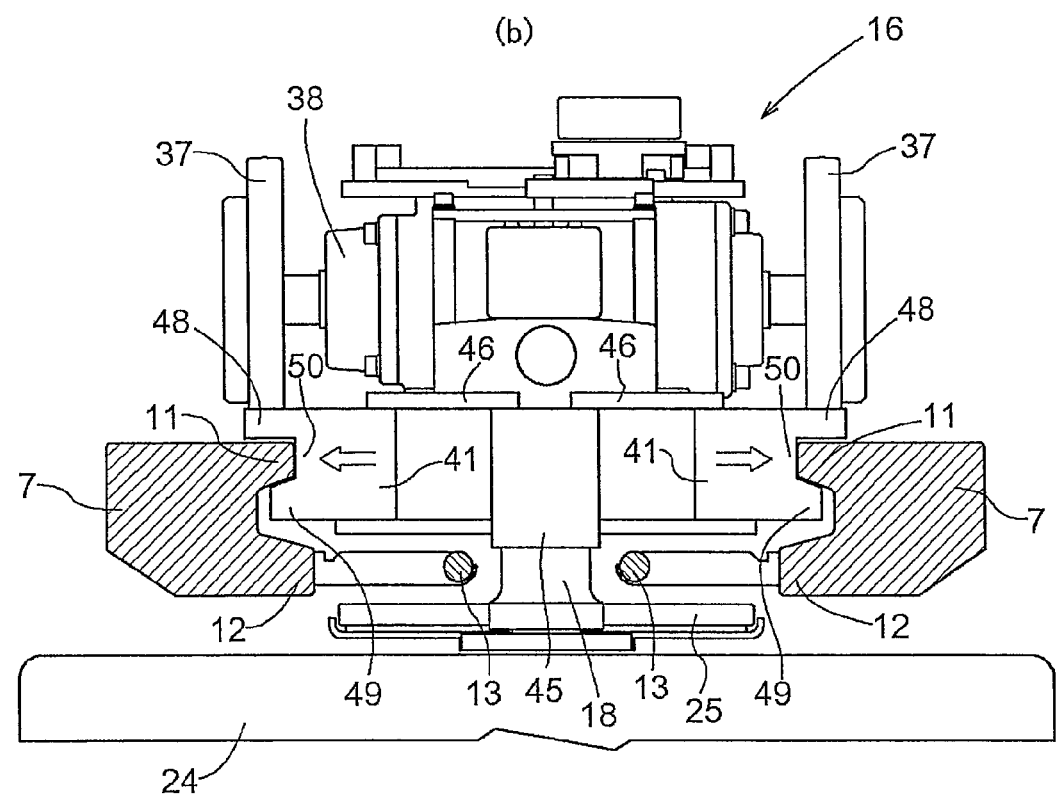

To further describe the guiding projections 11, as shown in FIG. 6, upper surfaces of the guiding projections 11 are formed as a flat horizontal surface, and these upper surfaces of the guiding projections 11 are the travel surfaces on which the travel wheels 37 of the travel portion 16 rotate. And, the undersurface of each guiding projection 11 is formed as a sloped surface which is lower toward the outward direction.

As shown in FIGS. 1-3, the storage shelf 3 is provided directly above the lower guide rail 4b. This storage shelf 3 includes a supporting plate 14 which receives and supports articles W, and is configured to store a plurality of articles W by supporting them on the supporting plate 14 such that the articles W are lined up along the higher set travel path. Incidentally, the supporting plate 14 is supported by the connecting members 8 of the lower guide rail 4b.

The ceiling transport vehicle 5 is described next.

Figure 4:
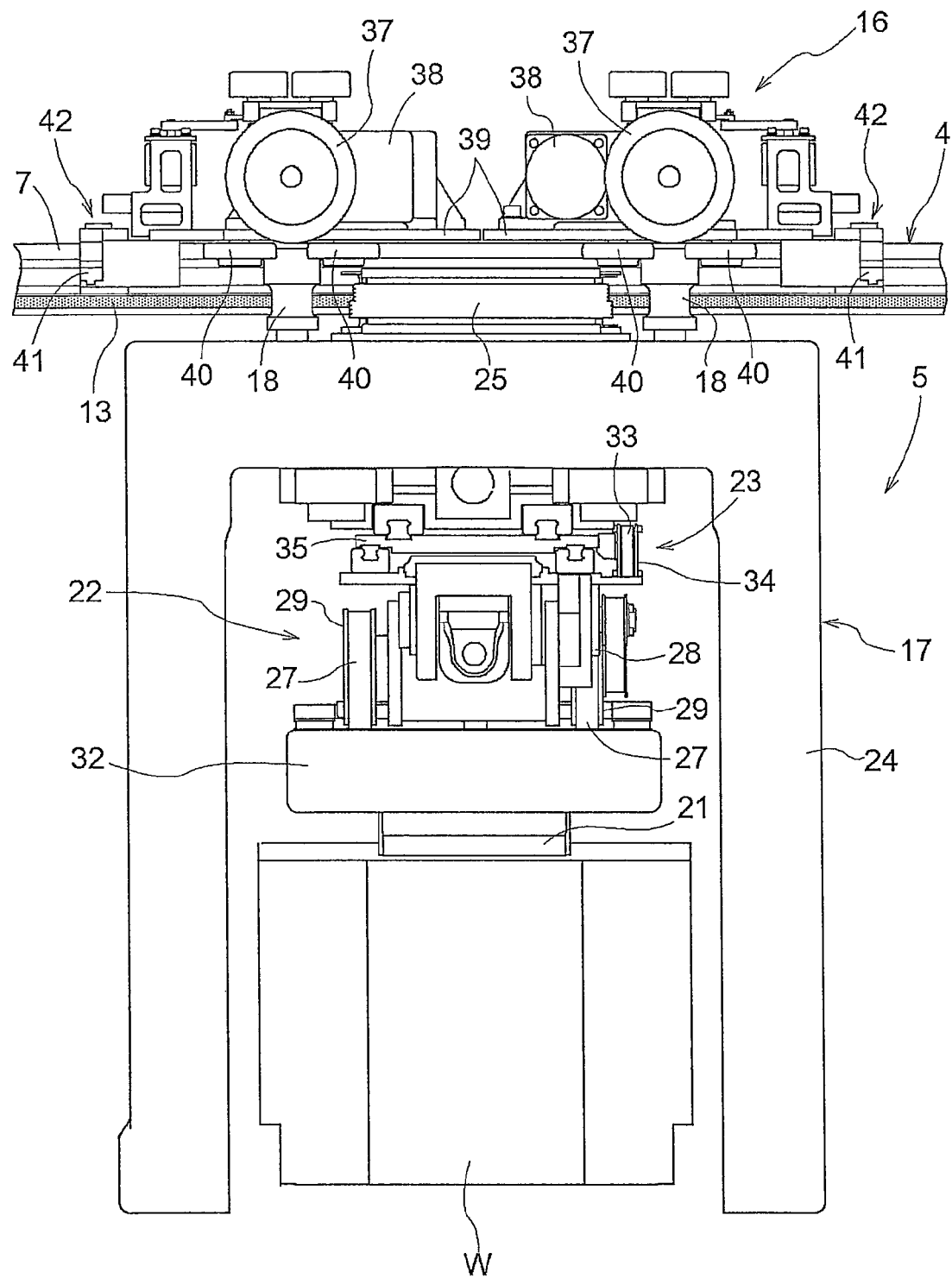
FIG. 4 is a side view of a ceiling transport vehicle.

As shown in FIGS. 4 and 5, the ceiling transport vehicle 5 includes a travel portion 16 which travels on the guide rail 4, and a main body portion 17 which is suspended and supported by the travel portion 16 and which supports an article W such that the article W can be moved vertically. And connecting members 18 for connecting the travel portion 16 and the main body portion 17 to each other are provided such that the connecting members 18 are located between the pair of rail portions 7.

The main body portion 17 includes a gripper 21 which functions as a support for supporting an article W, vertical movement operating means 22 for vertically moving the gripper 21, slide operating means 23 for sliding and moving the vertical movement operating means 22 and the support 21 in the lateral width direction with respect to the travel portion 16 between a retracted position directly below the travel portion 16 and a projected position which is displaced in the lateral width direction with respect to the travel portion 16, and a cover body 24 which covers an areas above, to both the front and back, and to one of the right and left sides of the article W supported by the gripper 21. And, the power receiving coil 25 is provided to the main body portion 17 such that it is located between the pair of rail portions 7. Magnetic field is generated by causing alternating current to run through the electricity supply lines 13 arranged along the guide rail 4. And the electric power required by the ceiling transport vehicle 5 is generated by the power receiving coil 25 using this magnetic field; thus, the electric power is supplied to the ceiling transport vehicle 5 contactlessly or without contact.

The vertical movement operating means 22 includes a rotatable drum 29 which spools two or more (for example, four) spooled belts 27 and which is rotated by the vertical movement motor 28, a switching mechanism 31 which is suspended and supported by the spooled belts 27 for switching the attitude of the gripper 21 between a gripping attitude in which the article W is gripped and a grip release attitude in which the grip is released by the operation of the gripper motor 30, and a vertical movement support 32 which supports the rotatable drum 29 and the switching mechanism 31. Any conventional flexible connecting material, such as wires, ropes, or timing belts, can be used in place of the spooled belts 27. And the vertical movement operating means 22 is capable of raising and lowering or vertically moving the gripper 21 and the article W supported thereby by rotating the rotatable drum 29 with the vertical movement motor 28, and is also configured to be able to grip and release the article W by switching the gripper 21 between the gripping attitude and the grip release attitude by operating the switching mechanism 31 by the gripper motor 30.

The slide operating means 23 includes a rotatable pulley 34 over which an endless belt 33 runs and which is drivingly rotated by a motor for sliding movement (not shown), a slide movement support 35 which rotatably supports the rotatable pulley 34, and a pair of slide rails which are provided between the main body portion 17 and the slide movement support 35 and which are spaced apart from each other in the fore and aft direction. Each of these slide rails is conventional and is formed to have such a shape that its cross section has a horizontal width in the central part in the vertical direction that is narrower than the horizontal width of its upper portion and of its lower portion. The upper portion is attached or mounted to one part while the lower portion is attached or mounted to the other part. And one of the upper portion and the lower portion can slide against the corresponding part while being supported thereby. And the slide movement support 35 is supported by the cover body 24 such that the support 35 can move in the lateral width direction and an upper portion of the endless belt 33 is connected to the main body portion 17 so that the slide movement support 35 is moved along the lateral width direction with respect to the cover body 24 as the endless belt 33 is rotated. And the vertical movement support 32 is supported by the slide movement support 35 such that the support 32 can move in the lateral width direction, and vertical movement support 32 is connected to a lower portion of the endless belt 33 so that the vertical movement support 32 is moved along the lateral width direction with respect to the slide movement support 35 as the endless belt 33 is rotated.

By rotating the rotatable pulley 34 with the motor for sliding movement and thus by rotating the endless belt 33 in a forward or reverse direction, the slide operating means 23 having the structure described above is configured to cause the slide movement support 35 and the vertical movement support 32 to slide and move to the same side along the lateral width direction, as the slide movement support 35 is caused to slide with respect to the travel portion 16 along the lateral width direction and as the vertical movement support 32 is caused to slide with respect to the slide movement support 35 in the lateral width direction. And, the slide operating means 23 is configured to be capable of sliding and moving the vertical movement operating means 22 and the gripper 21 between a retracted position in which the vertical movement operating means 22 and the gripper 21 are retracted toward the travel portion 16 such that the vertical movement operating means 22 and the gripper 21 are located directly below the travel portion 16 as shown in FIG. 5 with phantom lines, and to a projected position in which the vertical movement operating means 22 and the gripper 21 are projected to one side along the lateral width direction such that the vertical movement operating means 22 and the gripper 21 are displaced to the one side along the lateral width direction from the position directly below the travel portion 16 as shown in FIG. 5 with solid lines. Incidentally, the projected position is displaced to the one side along the lateral width direction to the extent that the vertical movement operating means 22 does not overlap with the travel portion 16 and the guide rail 4 as seen along the vertical direction.

The slide operating means 23 is not limited to the structure having the configuration described above and other conventional mechanism for moving one member linearly with respect to another member may be used instead. For example, in place of the endless belt 33 and the rotatable pulley 34, it is possible to adapt a structure such as a ball screw with one end of its screw shaft being fixed to the main body portion 17 and a ball portion being fixed to the vertical movement support 32 so that the vertical movement support 32 is moved with respect to the main body portion 17 when the screw shaft is rotated. As another example, in place of the ball screw, the movement can be made with a pinion gear fixed to one member and a rack that is fixed to another member and that engages directly, or indirectly through other gear(s), with the pinion gear.

As shown in FIG. 2, the ceiling transport vehicle 5 that travels along the higher guide rail 4a is configured to transfer an article W to or from a station 1 by vertically moving the gripper 21 with the vertical movement operating means 22 located in the retracted position, and to transfer an article W to or from the storage shelf 3 by vertically moving the gripper 21 with the vertical movement operating means 22 located in the projected position. In addition, as shown in FIG. 3, the ceiling transport vehicle 5 that travels along the lower guide rail 4b is configured to transfer an article W to or from a station 1 by vertically moving the gripper 21 with the vertical movement operating means 22 located in the projected position. In addition, the station 1 represents an article transfer position for the ceiling transport vehicle 5 that travels along the higher guide rail 4a and for the ceiling transport vehicle that travels along the lower guide rail 4b, and the storage shelf 3 represents an article transfer position for the ceiling transport vehicle 5 that travels along the higher guide rail 4a.

As shown in FIGS. 4-6, the travel portion 16 includes travel wheels 37 which rotate or roll on the guide rail 4, a travel motor 38 which rotate and drive the travel wheels 37, and travel supports 39 which support these travel wheels 37 and the travel motor 38. And a pair of travel supports 39 are provided such that one support is behind the other in the travel direction, Supported to each of the pair of travel supports 39 are the pair of travel wheels 37 each of which is provided for each of the pair of rail portions 7, and the single travel motor 38 which rotate and drive the pair of travel wheels 37. Also, each of the pair of travel supports 39 is connected to the main body portion 17 through the connecting member 18 such that each support is rotatable about a vertical axis.

Provided to the ceiling transport vehicle 5 are a pair of guiding bodies 40 which contact respective ones of the right and left lateral side faces of the guide rail 4 to guide the travel portion 16 along the set travel path, a pair of contacting members 41 which can move away from or toward each other in the lateral width direction (i.e., capable of movement away from each other and movement toward each other), and switching means 42 (FIG. 4) which can switch—by moving each of this pair of contacting members 41 away from or toward each other—between a holding state in which the position of the travel portion 16 in the lateral width direction with respect to the guide rail 4 is positioned and held at the article transfer position (see FIGS. 7(b) and 8(b)) by causing the pair of contacting members 41 to contact respective ones of the right and left lateral side faces of the guide rail 4, and a holding release state (see FIGS. 6(a) and 8(a)) in which the pair of contacting members 41 are spaced apart from the guide rail 4. The pair of guiding bodies 40, the pair of contacting members 41, and the switching means 42 are supported by the travel portion 16. Incidentally, the connecting members 18 are connected to a central part of the travel portion 16 in the lateral width direction, more specifically, to central parts of the travel supports 39 in the lateral width direction. And, as shown in FIG. 6, the position at which the central position between the pair of rail portions 7 (guide rail 4) in the lateral width direction coincides with the central position of the travel portion 16 in the lateral width direction is set to be the article transfer position for the travel portion 16. Thus, when the travel portion 16 is located at the article transfer position, the connecting members 18 are at a position equally spaced from the pair of rail portions 7.

As shown in FIG. 4, two sets of the pair of guiding bodies 40 are supported by each of the pair of travel supports 39 with one set of guiding bodies 40 located behind the other set so that a total of four sets of guiding bodies 40 are provided to the ceiling transport vehicle 5. In addition, the pair of contacting members 41 and the switching means 42 are supported by each of the pair of travel supports 39 so that a total of two sets of contacting members 41 and two switching means 42 are provided to the ceiling transport vehicle 5. And the pair of contacting members 41 and the switching means 42 that are supported by the front travel support 39 such that they are located forward of the two sets of guiding bodies 40 supported by the front travel support 39. And the pair of contacting members 41 and the switching means 42 that are supported by the rear travel support 39 such that they are located rearward of the two sets of guiding bodies 40 supported by the rear travel support 39. The pair of contacting members 41 and the switching means 42 that are supported in this manner are provided to each of the forward end portion and the back end portion of the travel portion 16.

Each of the pair of guiding bodies 40 includes a rotatable roller which can rotate about a vertical axis. And the pair of guiding bodies 40 are provided such that they are located between the pair of rail portions 7 and such that each contacts an inwardly facing vertical surface of the guiding projection 11 of each of the pair of rail portions 7. And when the travel portion 16 travels along the set travel path, the pair of guiding bodies 40 are configured to guide the travel portion 16 along the set travel path by virtue of the fact that the travel portion 16 is prevented from being displaced or, deviating from the set travel path toward one side in the lateral width direction by the guiding body 40 on the one side contacting the rail portion 7 on the one side, and of the fact that the travel portion 16 is prevented from being displaced or deviating from the set travel path toward the other side in the lateral width direction by the guiding body 40 on the other side contacting the rail portion 7 on the other side. In addition, each of the pair of guiding bodies is formed of elastic material, such as urethane which can be elastically deformed.

Figure 7:
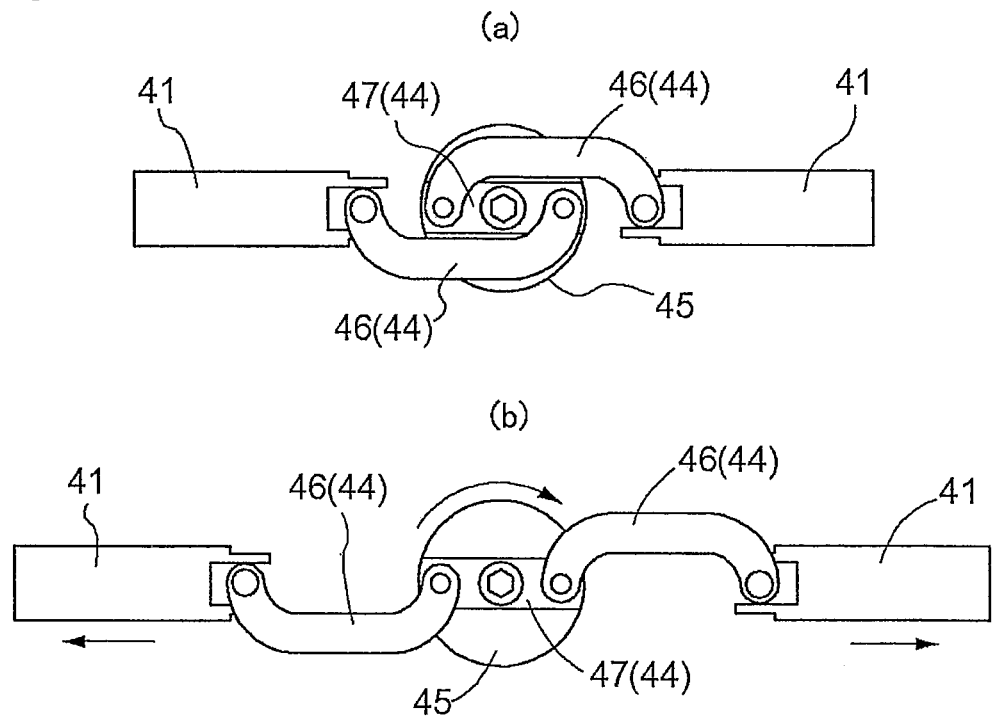
FIG. 7 is a plan view of the switching means.

As shown in FIG. 7, the switching means 42 includes an operatively connecting mechanism 44 which operatively connects the pair of contacting members 41, and a motor 45 for holding as a single actuator that operates the operatively connecting mechanism 44.

And the operatively connecting mechanism 44 includes a pair of link members 46 to which each of the pair of contacting members 41 is separately connected, and a rotating body 47 which can rotate about a vertical axis and to which the pair of link members 46 are connected. The motor 45 for holding is provided to rotate and drive the rotating body 47 in forward and reverse directions.

The pair of link members 46 are arranged such that one is behind the other in the travel direction and such that they are displaced from each other in the lateral width direction. The contacting member 41 is connected to an outward end, in the lateral width direction, of each of the pair of link members 46, and the rotating body 47 is connected to its inward end in the lateral width direction. The rotating body 47 is configured to perform a pull-in operation in which each of the pair of link members 46 is pulled toward the rotating body 47 and a push-out operation in which each of the pair of link members 46 is pushed away from the rotating body 47, as the rotating body 47 is rotated in the forward or reverse direction by the motor 45 for holding, about a point located between the connection points at which the pair of link members 46 are connected. In addition, the switching means 42 is configured to have a shape that is symmetric about a central point of the rotating body 47 and is configured to move the pair-of contacting members 41 along the lateral width direction by the same amount when switching to the holding state or to the holding release state. And, the switching means 42 is supported by the travel support 39 such that the center of the rotating body 47 is located at the center of the travel portion 16 in the lateral width direction.

And the switching means 42 is configured to switch from the state shown in FIG. 7(a) to the holding state by rotating the rotating body 47 in the forward direction (or one direction) by the motor 45 for holding to push the pair of link members 46 away from the rotating body 47 and to move each of the pair of the contacting members 41 away from the other as shown in FIG. 7(b). The switching means 42 is also configured to switch from the state shown in FIG. 7(b) to the holding release state by rotating the rotating body 47 in the reverse direction (or the other direction) by the motor 45 for holding to pull the pair of link members 46 toward the rotating body 47 and to move each of the pair of the contacting members 41 toward the other as shown in FIG. 7(a).

As shown in FIG. 6, the pair of contacting members 41 are provided such that they are located between the pair of rail portions 7 and such that they are spaced apart from the pair of guiding bodies 40 in the travel direction. The pair of contacting members 41 provided as such are configured to contact respective inwardly facing vertical surfaces of the guiding projections 11 of the pair of rail portions 7 when switched to the holding state, like the pair of guiding bodies 40. In addition, the contacting member includes hard material, such as metal or plastic.

To describe more about the contacting members 41, each of the pair of contacting members 41 has an upper restricting portion 48 which is formed in its upper end portion and which projects outwardly in the lateral width direction, a lower restricting portion 49 which is formed in the lower end portion and which projects outwardly in the lateral width direction, and a contacting portion 50 which is formed between the upper restricting portion 48 and the lower restricting portion 49 and which has a contact surface for contacting the vertical surface of the guiding projection 11. In addition, the lower restricting portion 49 corresponds to the restricting member, and the vertical surfaces of the guiding projections 11 correspond to the lateral right and left side faces of the guide rail 4 against which the contacting members 41 contact.

The contact surface of the contacting portion 50 is formed to extend vertically, and the undersurface of the upper restricting portion 48 is formed as a flat horizontal surface. And the upper surface of the lower restricting portion 49 is formed as a sloped surface that is lower toward the outer edge. And the vertical width of the contact surface of the contacting portion 50 is formed to be wider than the vertical width of the vertical surface of the guiding projection 11. When the travel portion 16 is in a horizontal attitude and when the contacting members 41 are switched to the holding state, gaps are formed between the undersurface of the upper restricting portion 48 and the upper surface of the guiding projection 11, and between the upper surface of the lower restricting portion 49 and the undersurface of the guiding projection 11. In addition, the upper surface of the lower restricting portion 49 is formed to be steeper than the undersurface of the guiding projection 11.

And when the contacting members 41 are switched to the holding state, the contacting portion 50 is in contact with the guiding projection 11: the upper restricting portion 48 is located directly above the guiding projection 11: and the lower restricting portion 49 is located directly below the guiding projection 11. And when the contacting members 41 are switched to the holding release state, the contacting portion 50 is moved away from the guiding projection 11: the upper restricting portion 48 and the lower restricting portion 49 are located inwardly of the guiding projection 11 in the lateral width direction.

Therefore, by switching to the holding state by moving each of the pair of contacting members 41 away from each other by the same amount by means of the switching means 42, even when the travel portion 16 is displaced from the article transfer position in the lateral width direction, the rail portion 7 on the side to which the travel portion 16 is displaced is pushed by the contacting member 41 of the pair of contacting members 41 that is on the same side. The travel portion 16 is then moved in the lateral width direction by the reaction force; therefore, the position of the travel portion 16 is corrected to the article transfer position. When the position of the travel portion 16 is corrected to the article transfer position, each of the pair of contacting members 41 contacts respective one of the pair of rail portions 7. And the travel portion 16 is positioned and held in the article transfer position by maintaining that state.

And in this holding state, because upper restricting portions 48 of the contacting members 41 are located directly above and adjacent the guiding projections 11 of the pair of rail portions 7 and because lower restricting portions 48 of the contacting members 41 are located directly below and adjacent the guiding projections 11 of the pair of rail portions 7, even when the load of the main body portion 17 is offset to one side in the lateral width direction as the vertical movement operating means 22 is moved to the projected position on the one side in the lateral width direction, the travel portion 16 is prevented from being lifted from the rail portion 7 located on the other side, thus preventing the tilting of the travel portion 16 because the lower restricting portion 49 of the contacting member 41 located on the other side in the lateral width direction abuts against the undersurface of the guiding projection 11 in the rail portion 7 located on the other side whereas the upper restricting portion 48 of the contacting member 41 located on the one side in the lateral width direction abuts against the upper surface of the guiding projection 11 in the rail portion 7 located on the one side, and because the travel wheel 37 is located on this upper surface of the guiding projection 11.

In addition, when switched to the holding release state by moving each of the pair of contacting members 41 toward each other by the same amount with the switching means 42, the upper restricting portions 48, the lower restricting portions 49, and the contacting portions 50 are moved inwardly in the lateral width direction from the rail portions 7, and the pair of contacting members 41 are respectively spaced apart from the pair of rail portions 7. Therefore, contacting of the guide rail 4 by the pair of contacting members 41 is avoided when the travel portion 16 travels along the set travel path, thus allowing the travel portion 16 to travel smoothly along the set travel path.

In a non-limiting embodiment described next with reference to FIG. 9, the shape of the contacting members differs from the shape of the contacting members in the first embodiment. Other parts, including the rail portions 7, are identical to the corresponding parts in the first embodiment, and the same reference numerals are used for those parts.

Figure 9:
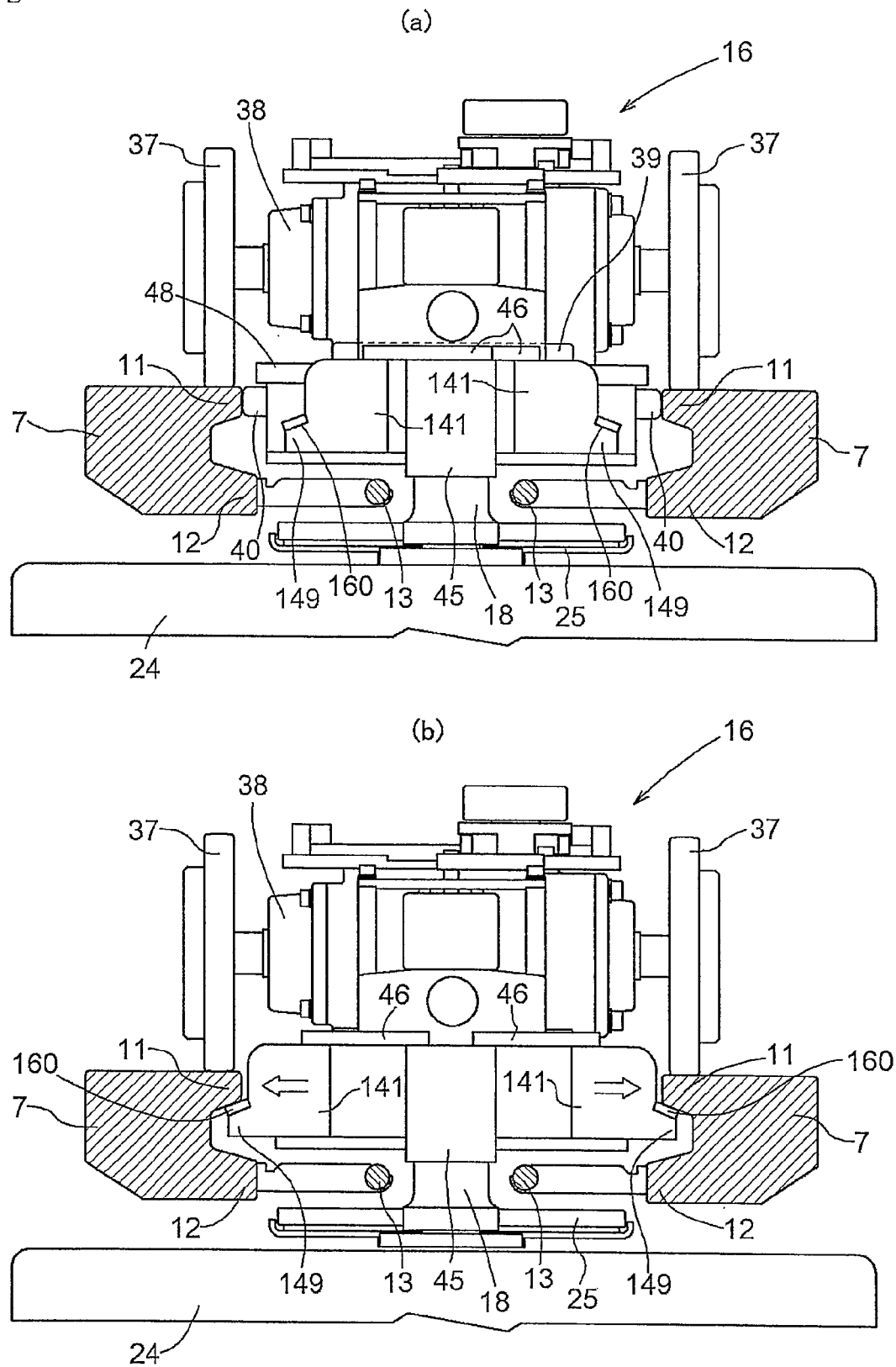
FIG. 9 is a front view of a travel portion showing a holding release state and a holding state of the contacting member in accordance with an alternative embodiment.

As shown in FIG. 9, the upper restricting portions 48 are not provided to the contacting member 141 of the second embodiment, unlike the contacting members in the first embodiment. Formed in each of the pair of contacting members 141 in this embodiment is a restricting portion 149 that projects outwardly in the lateral width direction and that contacts the inclining undersurface of the guiding projection 11 of the corresponding rail portion 7. And, a resin layer 160 is fixed to the upper surface of the inclining restricting portion 149 by a conventional fixing method, such as an adhesive or bolts. Thus, wear due to the contact between the restricting portion 149 and the rail portion 7 can be reduced by providing the resin layer 160. The pair of contacting members 141 can be moved between the holding release state shown in FIG. 9(a) and the holding state shown in FIG. 9(b) by the switching means 42 in the first embodiment.

By providing such contacting members 141, even when the load of the main body portion 17 is offset to one side in the lateral width direction as the vertical movement operating means 22 is moved to the projected position on the one side in the lateral width direction, the travel portion 16 is prevented from being lifted from the rail portion 7 located on the other side, thus preventing the tilting of the travel portion 16 by switching the contacting members 141 to the holding state, because the travel wheel 37 abuts against the upper surface of the guiding projection 11 on the one side in the lateral width direction, and because the restricting portion 149 abuts against the undersurface of the guiding projection 11 of the rail portion 7 on the other side in the lateral width direction. Thus, by having such contacting members 141 of the simple shape without the upper restricting portions 48, the manufacturing process of the contacting members 141 may be simplified, and the unit price of this part can be lowered.

Figure 8:
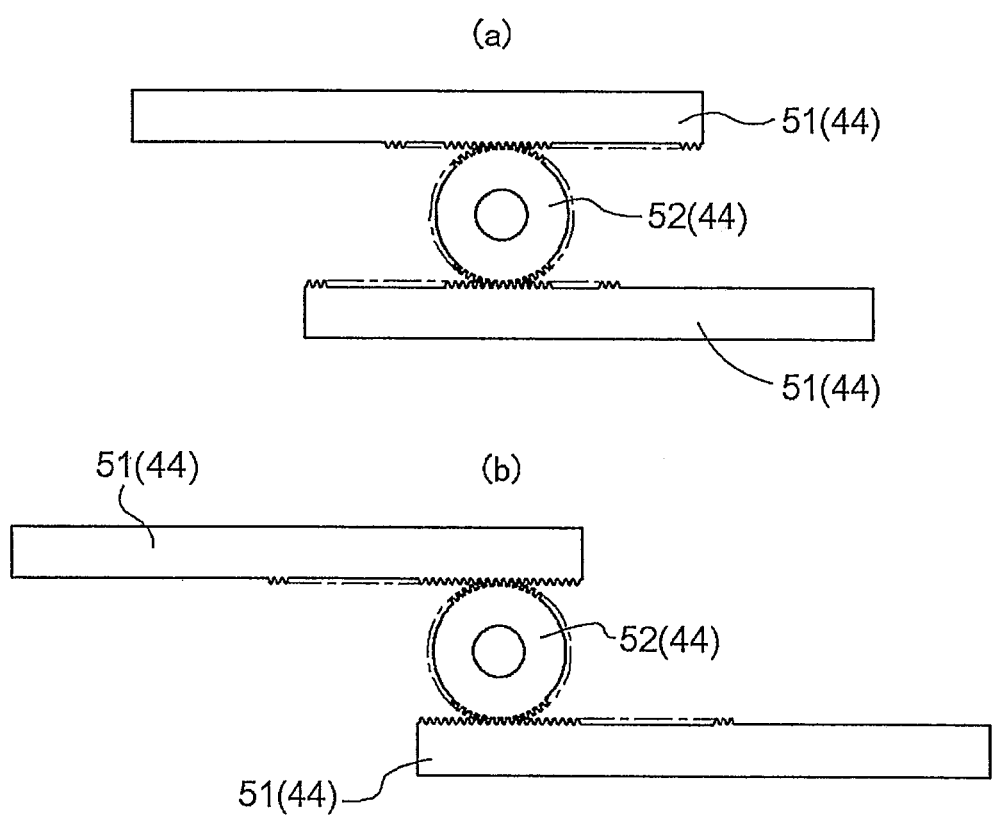
FIG. 8 is a plan view of the switching means in accordance with an alternative embodiment.

(1) In the embodiment described above, the operatively connecting mechanism 44 includes the pair of link members 46 to which the pair of contacting members 41 are separately connected, and the rotating body 47 which can rotate about a vertical axis and to which the pair of link members 46 are connected. However, as shown in FIG. 8, the operatively connecting mechanism 44 may include a pair of racks 51 to which the pair of contacting members 41 are separately connected, and a pinion gear 52 which mesh with the pair of racks 51. Thus, when the operatively connecting mechanism 44 is configured this way, the switching means 42 can be switched between the holding state and the holding release state by rotating the pinion 52 in forward and reverse directions with the motor 45 for holding.

Alternatively, the operatively connecting mechanism 44 may include a rotatable shaft in which a right-handed thread and a left-handed thread are formed, a movable body which meshes with the right-handed thread and to which one contacting member 41 is connected, and another movable body which meshes with the left-handed thread and to which one contacting member 41 is connected. Thus, when the operatively connecting mechanism 44 is configured this way, the switching means 42 can be switched between the holding state and the holding release state by rotating the rotatable shaft in forward and reverse directions with the motor 45 for holding.

(2) In the embodiment described above, the switching means 42 includes the motor 45 for holding as an actuator. However, the switching means 42 may include a hydraulic cylinder as an actuator. Thus, when the actuator includes a hydraulic cylinder, for example, each of the pair of contacting members 41 may be separately connected to each of the pair of rods of the double rod cylinder and the switching means 42 can be switched between the holding state and the holding release state by operating the double rod cylinder.

(3) In the embodiment described above, the switching means 42 includes the operatively connecting mechanism 44 which operatively connects the pair of contacting members 41, and the single actuator which operates the operatively connecting mechanism 44. However, the switching means 42 may include a pair of actuators and a pair of connecting mechanisms which operatively connect the contacting members 41s and the actuators.

(4) In the embodiment described above, a pair of contacting members 41 are provided between the pair of rail portions 7, and the switching means 42 is configured to switch to the holding state by moving the pair of contacting members 41 away from each other and to the holding release state by moving the pair of contacting members 41 toward each other. However, a pair of contacting members 41 may be provided outwardly of the pair of rail portions 7 in the lateral width direction, and the switching means 42 may be configured to switch to the holding state by moving the pair of contacting members 41 toward each other and to the holding release state by moving the pair of contacting members 41 away from each other. Alternatively, the guide rail 4 may be formed from a single rail. In this case, a pair of contacting members 41 may be provided outward of the rail in the lateral width direction, and the switching means 42 may be configured to switch to the holding state by moving the pair of contacting members 41 toward each other and to the holding release state by moving the pair of contacting members 41 away from each other.

In the embodiment described above, the travel portion 16 supports the pair of contacting members 41 and the switching means 42. However, the main body portion 17 may instead support the pair of contacting member 41 and the switching means 42.

(5) In the embodiment described above, the pair of contacting members 41 and the switching means 42 are provided to each of the forward end portion and the back end portion of the travel portion 16. However, the pair of contacting members 41 and the switching means 42 may be provided to only one of the forward end portion and the back end portion of the travel portion 16. Alternatively, the pair of contacting members 41 and the switching means 42 may be provided to middle portion of the travel portion 16 with respect to the travel direction.

(6) In the first embodiment, the contacting members 41 are provided with the upper restricting portion 48 and the lower restricting portion 49. However, as exemplified by the second embodiment, one of the upper restricting portion 48 and the lower restricting portion 49 or both of these may not be provided to the contacting members 41. While it is possible to for the contacting members with the structure disclosed in the second embodiment to be used when the slide operating means 23 is provided to the main body portion 17 as in the second embodiment, they may be used even when the slide operating means 23 is not provided to the main body portion 17.

And, for example, when the vertical movement support 22 is slid and moved from the retracted position to only one side in the lateral width direction as in the embodiment described above, it is unnecessary to provide the upper restricting portion 48 of the contacting member 41 on one side or the lower restricting portion 49 of the contacting member 41 on the other side. Incidentally, for example, when the vertical movement support 22 is slid and moved from the retracted position to both sides in the lateral width direction as in the embodiment described above, both of the pair of contacting members 41 may be provided with the upper restricting portion 48 and the lower restricting portion 49.

(7) In the embodiment described above, the pair of contacting members 41 are provided such as to contact the inwardly facing vertical surface of the guiding projection 11 of each of the pair of rail portions 7 when switched to the holding state. However, the pair of contacting members 41 may be provided such as to contact an inwardly facing vertical surface located between the guiding projection 11 of each of the pair of rail portions 7 and the projection 12 for the electricity supply line when switched to the holding state. Also, the pair of contacting members 41 are provided such that they are spaced apart from the pair of guiding bodies 40 in the travel direction. However, for example, the pair of contacting members 41 may be provided such that they are spaced apart from the pair of guiding bodies 40 in the vertical direction; thus, the pair of contacting members 41 do not have to be provided such that they are spaced apart from the pair of guiding bodies 40 in the travel direction.

The invention claimed is:

1. A ceiling transport vehicle comprising:
a travel portion that travels along a guide rail installed on a ceiling side along a set travel path;
a main body portion that is suspended and supported by the travel portion and that supports an article such that the article can be moved vertically; and
a pair of guiding bodies that contact right and left lateral sides of the guide rail to guide the travel portion along the set travel path;
wherein the guide rail includes a pair of rail portions spaced apart from each other in a lateral width direction that is perpendicular to a travel direction of the travel portion,
the travel portion includes a pair of travel wheels rotating in contact with a top surface of the guide rail,
the pair of travel wheels are disposed on the pair of rail portions correspondingly,
the pair of guiding bodies each include a rotatable roller which can rotate about a vertical axis, and
the ceiling transport vehicle further comprises:
a pair of contacting members that are supported by one of the travel portion and the main body portion such that the contacting members can be moved away from each other and moved toward each other in the lateral width direction, the pair of contacting members being disposed independently of the pair of travel wheels and the pair of guiding bodies;
a switching arrangement for moving each of the pair of contacting members away from each other and toward each other to switch between a holding state in which the travel portion is positioned and held in an article transfer position in the lateral width direction with respect to the guide rail, and a holding release state in which the pair of contacting members are spaced apart from and not in contact with the guide rail, the pair of contacting members includes a first contacting member provided in a first lateral side representing one side in the lateral width direction, and a second contacting member provided in a second lateral side representing the other side in the lateral width direction, the pair of rail portions includes a first rail portion provided in the first lateral side, and a second rail portion provided in the second lateral side, and the first contacting member contacts the first rail portion in the holding state toward a direction opposite to a direction toward which the second contacting member contacts the second rail portion in the holding state.

2. The ceiling transport vehicle according to claim 1, wherein the switching arrangement is configured to move each of the pair of contacting members away from each other to switch to the holding state, and to move each of the pair of contacting members toward each other to switch to the holding release state.

3. The ceiling transport vehicle according to claim 1, wherein the main body portion includes a support for supporting the article, a vertical movement operating arrangement for vertically moving the support, and a slide operating arrangement for slidingly moving the vertical movement operating arrangement and the support with respect to the said travel portion in the lateral width direction between a retracted position directly below the travel portion and a projected position which is displaced to one side in the lateral width direction with respect to the said travel portion, wherein a contacting member, of the pair of contacting members, located on an opposite side from the projected position with respect to the retracted position has a restricting member that is supported by the travel portion and that contacts an undersurface of the guide rail to restrict tilting of the travel portion.

4. The ceiling transport vehicle according to claim 1, wherein the pair of contacting members are located in such positions as to overlap with the pair of guiding bodies as seen in the travel direction.

5. The ceiling transport vehicle according to claim 1, wherein the switching arrangement includes an operatively connecting mechanism which operatively connects the pair of contacting members, and an actuator which operates the operatively connecting mechanism.

6. The ceiling transport vehicle according to claim 5, wherein the actuator actuates the operatively connecting mechanism to move the pair of contacting members away from each other and to move the pair of contacting members toward each other.

7. The ceiling transport vehicle according to claim 5, wherein the operatively connecting mechanism includes a rotating body, a space defined between the pair of contacting members in the lateral width direction varies with a rotational position of the rotating body, and the actuator rotates the rotating body in a forward direction and a reverse direction.

8. The ceiling transport vehicle according to claim 1, wherein the pair of contacting members are located between the pair of rail portions, the first contacting member and the second contacting member each include a first top inclining surface slanting downward toward an outer side in the lateral width direction, the first rail portion and the second rail portion each include a second bottom inclining surface slanting upward toward an inner side in the lateral width direction, and in the holding state, the first top inclining surface of the first contacting member contacts the second bottom inclining surface of the first rail portion, and the first top inclining surface of the second contacting member contacts the second bottom inclining surface of the second rail portion.

* * * * *